United States Patent
Belyansky et al.

(10) Patent No.: US 7,691,701 B1
(45) Date of Patent: Apr. 6, 2010

(54) METHOD OF FORMING GATE STACK AND STRUCTURE THEREOF

(75) Inventors: Michael P. Belyansky, Bethel, CT (US); Siddarth A. Krishnan, Peekskill, NY (US); Unoh Kwon, Fishkill, NY (US); Naim Moumen, Walden, NY (US); Ravikumar Ramachandran, Pleasantville, NY (US); James Kenyon Schaeffer, Wappingers Falls, NY (US); Richard Wise, Newburgh, NY (US); Keith Kwong Hon Wong, Wappingers Falls, NY (US); Hongwen Yan, Somers, NY (US)

(73) Assignees: International Business Machines Corporation, Armonk, NY (US); Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/348,332

(22) Filed: Jan. 5, 2009

(51) Int. Cl.
*H01L 21/00* (2006.01)

(52) U.S. Cl. ............ 438/229; 438/275; 438/592; 257/E21.63

(58) Field of Classification Search ............ 257/E21.63; 438/229–231, 275, 585–595
See application file for complete search history.

(56) References Cited

U.S. PATENT DOCUMENTS

| 4,877,755 | A | * | 10/1989 | Rodder | .................. 438/586 |
|---|---|---|---|---|---|
| 6,103,610 | A | * | 8/2000 | Blair | .................. 438/592 |
| 6,444,512 | B1 | | 9/2002 | Madhukar et al. | |
| 6,545,324 | B2 | | 4/2003 | Madhukar et al. | |
| 6,790,719 | B1 | | 9/2004 | Adetutu et al. | |
| 6,794,281 | B2 | | 9/2004 | Madhukar et al. | |
| 6,897,095 | B1 | | 5/2005 | Adetutu et al. | |

OTHER PUBLICATIONS

Samavedam et al., "Dual-Metal Gate CMOS with HfO$_2$ Gate Dielectric," 2002 IEDM Technical Digest, pp. 17.2.1-17.2.4, 2002.

* cited by examiner

*Primary Examiner*—Richard A. Booth
(74) *Attorney, Agent, or Firm*—Yuanmin Cai

(57) ABSTRACT

Embodiments of the present invention provide a method of forming gate stacks for field-effect-transistors. The method includes forming a metal-containing layer directly on a first titanium-nitride (TiN) layer, the first TiN layer covering areas of a semiconductor substrate designated for first and second types of field-effect-transistors; forming a capping layer of a second TiN layer on top of the metal-containing layer; patterning the second TiN layer and the metal-containing layer to cover only a first portion of the first TiN layer, the first portion of the first TiN layer covering an area designated for the first type of field-effect-transistors; etching away a second portion of the first TiN layer exposed by the patterning while protecting the first portion of the first TiN layer, from the etching, through covering with at least a portion of thickness of the patterned metal-containing layer; and forming a third TiN layer covering an areas of the semiconductor substrate designated for the second type of field-effect-transistors.

27 Claims, 5 Drawing Sheets

METHOD OF FORMING GATE STACK AND STRUCTURE THEREOF

FIELD OF THE INVENTION

The present invention relates to the field of semiconductor device manufacturing. In particular, it relates to the formation of gate stack of a high-k metal gate field-effect-transistor and the structure thereof.

BACKGROUND OF THE INVENTION

In the field of semiconductor device manufacturing, active semiconductor devices are generally manufactured by front end of the line (FEOL) technologies. Such active semiconductor devices may include, e.g., transistors like field-effect-transistors (FET) and particularly complementary metal-oxide-semiconductor field-effect-transistors (CMOS-FET). Among different types of CMOS-FETs there may be a p-type doped CMOS-FET (PFET) and an n-type doped CMOS-FET (NFET). Different types of CMOS-FETs may be formed or manufactured on a common substrate or structure, of a semiconductor chip or wafer.

In pursuing further performance improvement of CMOS-FET transistors and devices thereof, dielectric materials of high dielectric constant, commonly known as k value of the dielectric material, have recently been used in forming part of the gate stack of CMOS-FET transistors. Additionally, other technologies for performance improvement may include using metal gate material instead of traditional gate material such as, for example, poly-silicon for better tailoring of threshold voltage and channel mobility. More specifically, with the application of metal gate on high k dielectric gate material, better screening of phonon scattering may be achieved in the dielectric which, as a result of lower defectives of metal comparing with traditional poly-silicon/high k dielectric interface, creates improved mobility of electrons and reduced Fermi level pinning, all of which contribute toward achieving desired threshold voltages of the CMOS-FET transistors and devices made from the transistors.

During a regular process of forming gate stacks, hard-masks are usually used to protect gate stack materials, which have been formed on a substrate, in areas where gate stacks are planned or designed to be formed eventually. Hard-masks are used in such a way that gate stack materials in areas, other than areas forming gate stacks, may be removed or etched away through a patterning process such as a wet-etching process. One of the most commonly used hard-masks, for example, is a combination of amorphous silicon with silicon dioxide ($SiO_2$) thereupon.

As is commonly known in the art, ammonia solutions have been generally used in wet-etching processes to etch silicon. However, regular ammonia solutions are typically selective to silicon oxide, which means that regular ammonia solutions will not etch, or at least not be able to provide effective etching of silicon oxide or silicon dioxide. Therefore, in order to be able to use a hard-mask made of amorphous silicon with silicon-dioxide covering the top thereof in the process, there may exist a need to use ammonia solutions of high concentration in order to break through the screen silicon oxide on top of the amorphous silicon before the underneath amorphous silicon may get etched and so patterned. Nevertheless, while ammonia solutions of high concentration may be able to break through the screen silicon oxide for the purpose of patterning underneath amorphous silicon, they have been known as a source of causing defectives in the silicon, such as causing impurity being etched out of silicon, resulting in deteriorations of devices made from the process. Therefore, there exists in the art a need for better and/or alternative processes and/or method of forming gate stack in making high-k metal gate (HK-MG) transistors.

SUMMARY OF EMBODIMENTS OF THE INVENTION

Embodiments of the present invention provide a method of forming gate stacks for field-effect-transistors. The method includes steps of forming a metal-containing layer directly on a first titanium-nitride (TiN) layer, the first TiN layer covering areas of a semiconductor substrate designated for first and second types of field-effect-transistors; forming a capping layer of a second TiN layer on top of the metal-containing layer; patterning the second TiN layer and the metal-containing layer to cover only a first portion of the first TiN layer, the first portion of the first TiN layer covering an area designated for the first type of field-effect-transistors; etching away a second portion of the first TiN layer exposed by the patterning while protecting the first portion of the first TiN layer, from the etching, through covering with at least a portion of thickness of the patterned metal-containing layer; and forming a third TiN layer covering an areas of the semiconductor substrate designated for the second type of field-effect-transistors.

According to one embodiment, forming the metal-containing layer includes forming a metal silicide layer containing at least one metal element, the metal element being selected from a group consisting of titanium (Ti), cobalt (Co), and nickel (Ni).

According to another embodiment, forming the metal silicide layer includes forming a stack layer of thin alternating metal/amorphous-silicon layers each having a thickness of about 3 to 4 nm with a total thickness of the stack layer of about 12 to 16 nm; and annealing the stack layer at a temperature suitable for forming the metal silicide layer, for example, at a temperature range of about 350 to 500 degree C., and for a time period of about 5 seconds to about 5 minutes.

According to yet another embodiment, etching the second portion of the first TiN layer includes applying a SC1 solution to the second portion of the first TiN layer, with the SC1 solution being a mixture of water ($H_2O$), $NH_4OH$, and $H_2O_2$, and selective to the metal-silicide layer. For example, the mixture of water ($H_2O$), $NH_4OH$, and $H_2O_2$ may have a mixing ratio, by volume, ranging from about 5:1:1 to about 50:1:1, and may be applied in a temperature range approximately from 25 to 65 degree C., and preferably from 45 to 55 degree C.

Embodiments of the present invention also include forming the third TiN layer on top of the metal-containing layer and forming a gate stack containing the metal-containing layer, wherein the metal-containing layer is a metal-silicide layer. In addition, forming the metal-containing layer includes forming a layer of tungsten (W) metal, through sputtering, the tungsten metal layer having a thickness from about 4 nm to about 20 nm, and removing the tungsten metal layer after etching the second portion of the first TiN layer away from the area of semiconductor substrate designated for the second type of field-effect-transistors to expose a hafnium-oxide layer. According to one embodiment, removing the tungsten metal layer includes applying a chemical etching solution to the tungsten, the chemical etching solution being selective to both TiN and $HfO_2$, with selectivity greater than 20:1.

Embodiments of the present invention further include, before forming the metal-containing layer on the first TiN layer, forming the first TiN layer on a hafnium-oxide (HfO2) layer, which is formed on a chemical oxide layer, the chemical oxide layer may be a silicon-oxide layer incorporating nitrogen and covering the areas of the semiconductor substrate designated for the first and second types of field-effect-transistors.

BRIEF DESCRIPTION OF THE DRAWINGS

The present invention will be understood and appreciated more fully from the following detailed description of the invention, taken in conjunction with the accompanying drawings of which.

Figure 2:
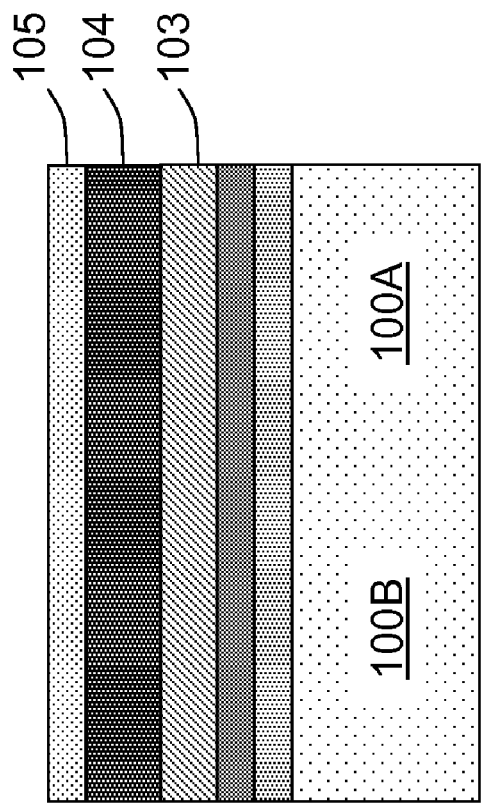
FIGS. 1-6 are demonstrative illustrations of steps of forming gate stack of high-k metal gate CMOS-FET transistors according to one embodiment of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

In the semiconductor device manufacturing industry, various types of active semiconductor devices such as transistors, including CMOS-FET of n-type (NFET) and/or p-type (PFET), may be created or formed on a single substrate of semiconductor by applying well-known FEOL processing technologies. The well-known FEOL technologies may include processing steps and/or operations of, among others, cap deposition, photo-resist-mask formation, photolithography, hard-mask formation, wet etching, reactive-ion etching (RIE), ion-implantation, and chemical-mechanical polishing (CMP), to list a few. During and/or after the formation of transistors, stress liners of the same or different types may be selectively applied to different types of transistors, for example, NFETs and PFETs, for device performance improvement.

In the following detailed description, well-known device processing techniques and/or steps may not be described in detail and, in some instances, may be referred to other published articles or patent applications in order not to obscure the description of the essence of presented invention as further detailed herein below.

Figure 1:
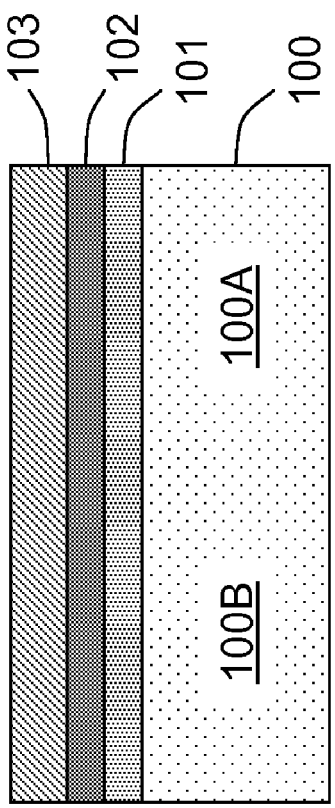

FIGS. 1-6 are demonstrative illustrations of steps of forming gate stack of high-k metal gate CMOS-FET transistors according to one embodiment of the present invention. More specifically, FIG. 1 illustrates a step in a process of forming gate stack on a semiconductor substrate 100. Semiconductor substrate 100 may include a first area 100A and a second area 100B thereupon different types of CMOS-FET transistors and devices may be formed eventually. For example, a PFET (or a NFET) transistor may be formed in area 100A and a NFET (or a PFET) transistor may be formed in area 100B. However, in order not to obscure description of essence of the present invention, following description will focus on how to form gate stacks of the NFET and PFET, and some details of forming transistors themselves and the structures thereof (such as source, drain, etc.) will be omitted in the description and not be shown in either FIG. 1 or subsequent figures as they are not considered as essential to the present invention. Moreover, a person skilled in the art will appreciate that the formation of, for example, channel, source, and/or drain of the FET devices, either PFET or NFET, may be made either before or after forming the gate stack, which will be described below in more details.

As being illustrated in FIG. 1 and according to present invention, one embodiment of the method may include first forming an interfacial layer of chemical oxide 101 on top of substrate 100, and then forming a hafnium oxide ($HfO_2$) layer 102 covering chemical oxide layer 101. Chemical oxide layer 101 may be some type of silicon dioxide and may incorporate nitrogen therein. Being an interfacing layer, chemical oxide layer 101 may have a thickness of approximately 0.5 nm to 2 nm, formed by either a wet process in a chemical solution containing Ozone or through a thermal oxidation process in an environment with temperature between 600 to 1000 C, for example, and provide good quality of passivation for the active surface underneath. The hafnium oxide layer 102 may also be replaced by other hafnium based dielectric such as, for example, hafnium silicate, hafnium oxy-nitride, hafnium silicon oxy-nitride. In addition, the stack of chemical oxide layer 101 and $HfO_2$ layer 102 may serve as gate oxide of various field-effect-transistors with hafnium oxide layer 102 having a high dielectric constant (high-k), generally greater than 4 and typically in the range from about 15 to about 35, for device performance improvement such as with reduced gate leakage current.

Next, embodiments of the method may include forming a titanium-nitride (TiN) layer 103 on top of $HfO_2$ layer 102, covering both areas 100A and 100B relating to or designated for forming first and second types of field-effect-transistors as described above. TiN layer 103 may be a titanium-nitride layer of first-type, or a first type of titanium-nitride layer, and may be particularly designed to be suitable for a first type of FET device, for example, to be build in area 100A later. TiN layer 103 may be part of a metal gate conductor of this first type of FET device. TiN layer 103 may have a thickness from about 1 nm to about 10 nm, preferably from about 2 nm to about 7 nm, and may be formed through various processes such as, for example, PVD, CVD, and/or ALD processes.

FIG. 2 illustrates another step of the method of forming gate stack following the step shown in FIG. 1. More specifically, embodiments of the method may include forming a metal-containing layer 104 directly on top of TiN layer 103 covering both area 100A and area 100B of semiconductor substrate 100. According to one embodiment, metal-containing layer 104 may be a metal-silicide layer containing at least one metal element, and more specifically may be a titanium-silicide layer, a cobalt-silicide layer, or a nickel-silicide layer. According to another embodiment, metal-containing layer 104 may be a metal layer of, for example, tungsten (W) or any other types of suitable metal.

When layer 104 is a metal-silicide layer, the forming of metal-silicide layer 104 may include first forming a stack layer of thin alternating metal/amorphous-silicon layers, with each thin layer of either metal or amorphous-silicon having a typical thickness of about 2-5 nm, and preferably between 3-4 nm. The formation of the stack layer of thin alternating metal/amorphous-silicon layers may be made through, for example, sputtering and/or PVD, CVD o ALD. The stack layer may preferably be formed to have a total thickness of about 4-20 nm, and preferably about 12-16 nm. The thickness of this stack layer is made such that a metal-silicide layer made subsequently from this stack layer through annealing, as described below in more details, may have a sufficient thickness to protect underneath TiN layer 103 when an exposed portion of the TiN layer 103 is being etched away.

The stack layer of thin alternating metal/amorphous-silicon layers may be subjected to an annealing process subsequently, in a temperature range around, for example, 300 to 600 degree C. The annealing process may last for a time period from approximately 5 to 300 seconds depending on the type of metal used and silicide formed. For example, a temperature range of about 400 to 500 degree C. and a time period of about 30 seconds to 5 minutes (300 seconds), preferably from about 30 seconds to 120 seconds, may be used to form cobalt-silicide. Also for example, a temperature range of about 350 to 450 degree C. and a time period of about 5 seconds to 2 minutes (120 seconds) may be used to form nickel-silicide. The annealing of stack layer may be conducted in a chamber of vacuum condition, or a gassed environment filled with inert gases such as argon or nitrogen. As described above, the metal element used in forming the silicide may include Ti, Co, Ni, and/or any other suitable metals or combination thereof.

When layer 104 is a metal layer, the metal layer 104 may be a tungsten layer which may be deposited onto TiN layer 103 through, for example, a physical vapor deposition (PVD) process.

As being illustrated in FIG. 2, embodiments of the method may include subsequently forming a capping layer 105, which may be a titanium-nitride (TiN) layer of second type, same or different from first type 103, on top of metal-containing layer 104. TiN capping layer 105 may be formed in preparation for a next step of performing patterning of the metal-containing layer 104. TiN capping layer 105 prevents possible oxidation of some oxygen sensitive material, such as cobalt in the metal-containing layer 104, to form oxide during follow-up processes, such as upon exiting from a deposition tool.

Figure 3:
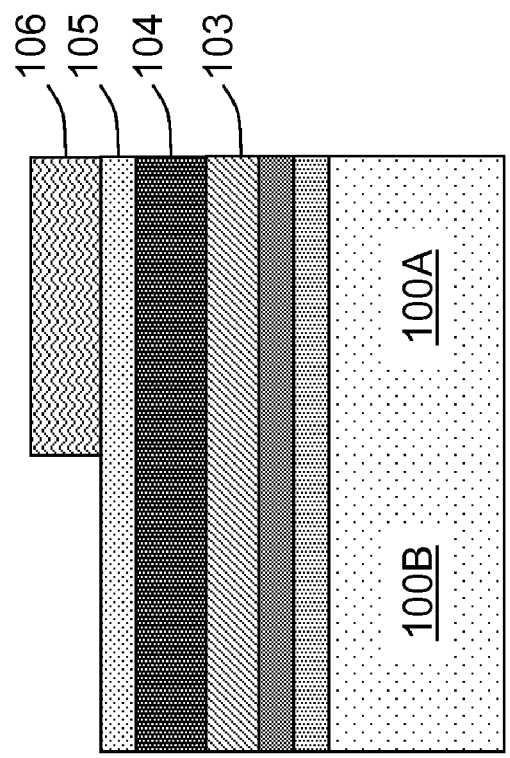

FIG. 3 illustrates another step of the method of forming gate stack following the step shown in FIG. 2. More specifically, on top of TiN capping layer 105, a layer of photoresist material 106 may be applied for patterning a first area that corresponds to an area designated or designed for forming the first type of FET devices. For example, photoresist layer 106 may cover the 100A area. Photoresist material 106 may be a positive or a negative type resist, depending on photo-exposure schemes used in the process. The properties of photoresist material 106 may be selected such that it may be able to withstand a reactive-ion-etching (RIE) process and provide adequate protection for devices/materials underneath.

Figure 4:
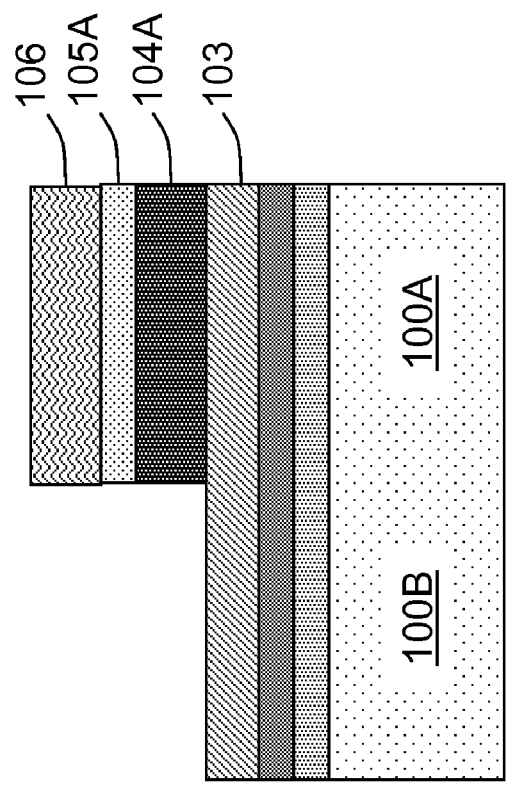

FIG. 4 illustrates yet another step of the method of forming gate stack following the step shown in FIG. 3. More specifically, embodiments of the method may include etching away selectively a portion of TiN capping layer 105, which is exposed and not covered by photoresist layer 106, and subsequently etching away a portion of metal-containing layer 104 that is exposed by the removal of the portion of TiN capping layer 105, in one or more etching steps. The etching may be performed in a reactive-ion-etching (RIE) process, and may be conducted in different multiple steps, and under different RIE conditions. For example, the RIE condition for etching TiN capping layer 105 may be a plasma etching process, and may include fluorine containing chemistry with argon in a ratio (fluorine:argon) from 1:5 to 1:1, and may be conducted in a chamber of pressure from about 10 mT to about 150 mT, under RF power from about 100 to 1000 W. Also for example, the RIE condition for patterning metal-containing layer 104, or metal layer 104, may include using halogen gases with argon or helium (He) with a ratio (halogen:argon, or halogen:helium) from 1:5 to 1:1 in a similar chamber pressure and RF power conditions as that for etching capping layer 105.

Having provided demonstrative examples for etching capping layer 105 and metal-containing layer 104, a person skilled in the art will appreciate that the present invention is not limited in this respect, and other existing and/or future developed technologies maybe used in the above patterning process by removing part of capping layer 105 and metal-containing layer 104 not covered by photoresist 106. The etching of metal-containing layer 104 may be controlled to stop at the first type of TiN layer 103, thus leaving a portion of second type of TiN layer 105 (which may be a first portion 105A of TiN layer 105) and a portion of metal-containing layer (which may be a first portion 104A of metal-containing layer 104) covering area 100A which is designated for or related to the first type of FET device.

Figure 5:
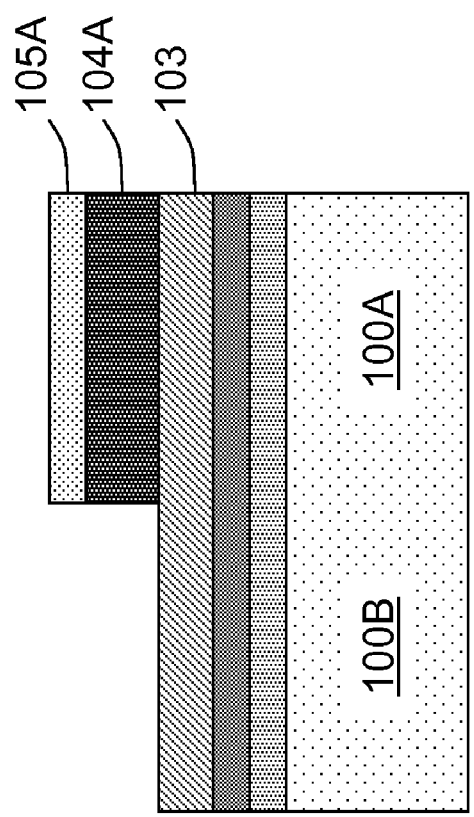

FIG. 5 illustrates another step of the method of forming gate stack following the step shown in FIG. 4. Embodiments of the method may subsequently include removing or stripping off photoresist layer 106 to expose patterned capping layer 105A. Capping layer 105A may be optionally removed at this stage but is not necessary. The patterned capping layer 105A (if not being removed) and patterned metal-containing layer 104A, together with exposed second portion of first type of TiN layer 103, are now ready for further processing and/or treatment.

Figure 6:
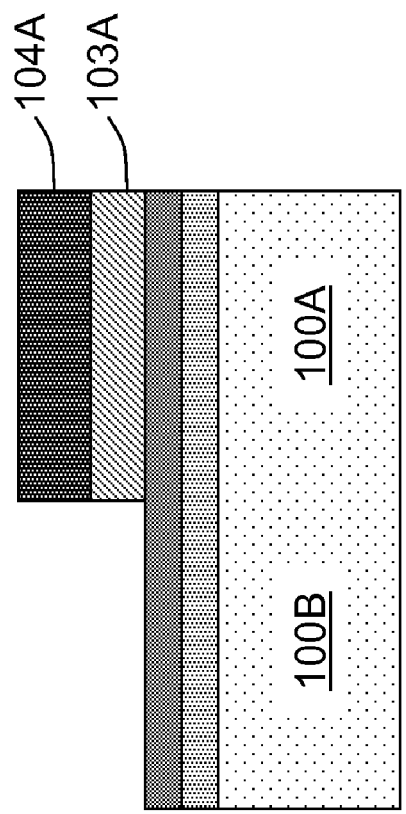

FIG. 6 illustrates yet another step of the method of forming gate stack following the step shown in FIG. 5. More specifically in this particular step, embodiments of the method may subject the exposed second portion of TiN layer 103 to a wet etching process in a SC1 solution (standard clean 1 solution, as is known in the art), in a temperature range approximately from 25 to 65 degree C., preferably from 45 to 55 degree C., for a time duration of approximately 120 seconds to 600 seconds. According to one embodiment, metal-containing layer 104A may be a metal-silicide layer and the SC1 solution may be a mixture of water ($H_2O$), $NH_4OH$, and $H_2O_2$, mixed in a ratio, in volume, ranging from about 5:1:1 to about 50:1:1. In other words, $NH_4OH$, and $H_2O_2$ may the mixed in a same ratio with 5 to 50 times more water ($H_2O$). Therefore, the SC1 solution may be selective or made to be selective to, and not etching or at least not etching effectively, metal-silicide layer 104A, which covers and thus protects underneath TiN layer 103. In the meantime, the exposed TiN layer 103 may be removed or etched away. According to another embodiment, metal-containing layer 104A may be a metal layer of tungsten (W), and the same or different SC1 solution which is a mixture of water ($H_2O$), $NH_4OH$, and $H_2O_2$ may be used as well. In this case, although SC1 solution is not completely selective to tungsten, the etching rate and/or the thickness of tungsten layer 104A, according to embodiments of the present invention, may be arranged and/or made such that there is at least a portion of tungsten layer 104A still remaining or being left even when the exposed second portion of TiN layer 103 being removed as being illustrated in FIG. 6 to expose underneath HfO$_2$ layer 102.

Figure 7:
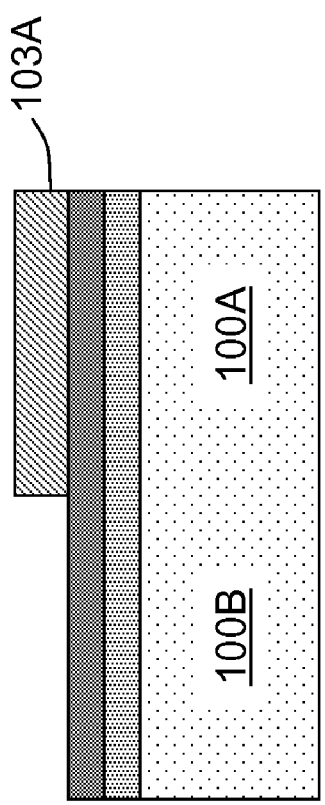

FIG. 7 illustrates another step of the method of forming gate stack following the step shown in FIG. 6 according to one embodiment of the present invention. In this embodiment, metal-containing layer 104A may be a metal layer of tungsten, or other suitable metals. However, metal layer 104A may be used as a sacrificial metal hard-mask. In this step illustrated in FIG. 7, metal layer 104A may be removed, for example, in a room temperature environment, for example 25 to 30 degree C., with hydrogen peroxide solution or any other suitable chemical etching solutions that is selective to TiN and HfO$_2$. According to one embodiment of the present invention, hydrogen peroxide solution may be used which is relatively selective to TiN layer 103 and underneath HfO$_2$ layer 102, when being compared with etching metal layer 104A, with a selectivity of generally greater than 20:1. Therefore, while metal layer 104A is being removed, damages to TiN layer 103 and HfO$_2$ layer 102, caused by the removal process of 104A, will be minimal, or limited if any.

Figure 8:
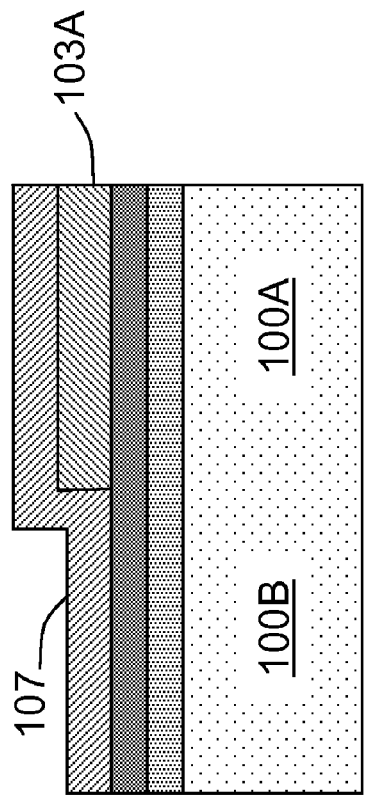
FIGS. 7-8 are demonstrative illustrations of steps of forming gate stack following the step shown in FIG. 6 according to one embodiment of the present invention.

FIG. 8 illustrates a step of the method of forming gate stack following the step shown in FIG. 7. After the removal of metal layer 104A, another titanium-nitride layer 107 may be applied onto the exposed area of HfO$_2$ layer 102 and the remaining TiN layer 103A. TiN layer 107 may be a third type of TiN layer or referred to as a third type of TiN layer, and the properties of TiN layer 107 including thickness may be tailored or designed to be particularly suitable for a second type of FET to be formed in 100B area of semiconductor substrate 100. For example, third TiN layer 107 may be formed similarly by applying known PVD, CVD or ALD processes but properties, such as thickness, of the third TiN layer 107 may be made or tuned differently from that of first TiN layer 103. Nevertheless, TiN layer 107 may also be made the same as TiN layer 103.

After the formation of first type of TiN layer 103A on 100A area relating to the first type of FET and second type of TiN layer 107 on 100B area relating to the second type of FET, any existing or conventional processes or any future developed technologies of forming high-k metal gate transistors may be applied to finish the formation of different types of CMOS-FETs on substrate 100.

Figure 9:
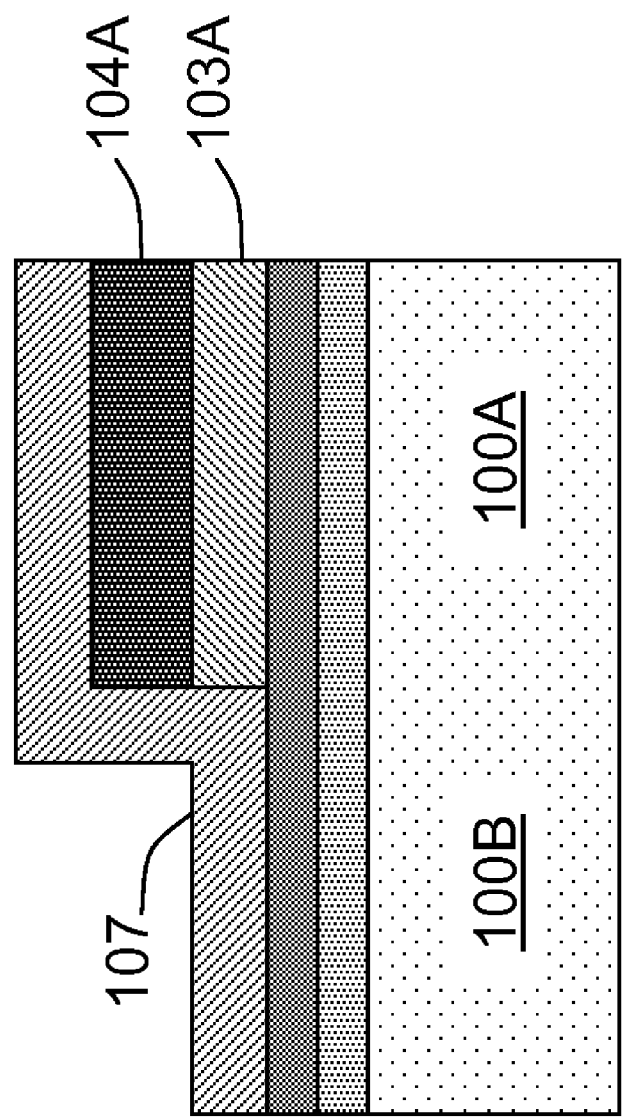
FIG. 9 is a demonstrative illustration of a step of forming gate stack following the step shown in FIG. 6 according to another embodiment of the present invention.

FIG. 9 illustrates yet a different step of the method of forming gate stack following the step shown in FIG. 6 according to another embodiment of the present invention. In this embodiment, metal-containing layer 104A may be a metal-silicide layer, such as Ti-silicide, Co-silicide, or Ni-silicide, and metal-silicide layer 104A may become part of a metal gate stack. In other words, there is no need to remove metal-silicide layer 104A in a separate step according to embodiment of the present invention. Therefore, following the removal of the exposed second portion of TiN layer 103, another titanium-nitride layer 107 may be applied onto the exposed area of HfO$_2$ layer 102, and on top of metal-silicide layer 104A. TiN layer 107 may be a third type of TiN layer and properties of TiN layer 107 may be tailored or designed, if necessary, to be particularly suitable for a second type of FET to be formed in 100B area of semiconductor substrate 100.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method of forming gate stacks for field-effect-transistors, the method comprising:
    forming a metal-containing layer directly on a first titanium-nitride (TiN) layer, said first TiN layer covering areas of a semiconductor substrate designated for first and second types of field-effect-transistors;
    forming a capping layer of a second TiN layer on top of said metal-containing layer;
    patterning said second TiN layer and said metal-containing layer to cover only a first portion of said first TiN layer, said first portion of said first TiN layer covering an area designated for said first type of field-effect-transistors;
    etching away a second portion of said first TiN layer exposed by said patterning while protecting said first portion of said first TiN layer, from said etching, through covering with at least a portion of thickness of said patterned metal-containing layer; and
    forming a third TiN layer covering an area of said semiconductor substrate designated for said second type of field-effect-transistors.

2. The method of claim 1, wherein forming said metal-containing layer comprises forming a metal silicide layer containing at least one metal element, said metal element being selected from a group consisting of titanium (Ti), cobalt (Co), and nickel (Ni).

3. The method of claim 2, wherein forming said metal silicide layer comprises:
    forming a stack layer of thin alternating metal/amorphous-silicon layers; and
    annealing said stack layer at a temperature suitable for forming said metal silicide layer.

4. The method of claim 3, wherein forming said metal silicide layer comprises forming a cobalt-silicide layer by:
    forming a stack layer of thin alternating cobalt/amorphous-silicon layers each having a thickness of about 3 to 4 nm and a total thickness of about 12 to 16 nm of said stack layer; and
    annealing said stack layer at a temperature range of about 400 to 500 degree C. and for a time period of about 30 seconds to 5 minutes.

5. The method of claim 3, wherein forming said metal silicide layer comprises forming a nickel-silicide layer by:
    forming a stack layer of thin alternating nickel/amorphous-silicon layers each having a thickness of about 3 to 4 nm and a total thickness of about 12 to 16 nm of said stack layer; and
    annealing said stack layer at a temperature range of about 350 to 450 degree C. and for a time period of about 5 seconds to 2 minutes.

6. The method of claim 1, wherein said etching comprises applying a SC1 solution to said second portion of said first TiN layer, said SC1 solution being a mixture of water (H$_2$O), NH$_4$OH, and H$_2$O$_2$, and being selective to said metal-silicide layer.

7. The method of claim 6, wherein applying said SC1 solution comprises applying a mixture of water (H$_2$O), NH$_4$OH, and H$_2$O$_2$, having a ratio in volume ranging from approximately 5:1:1 to approximately 50:1:1, in etching said second portion of said first TiN layer.

8. The method of claim 7, wherein applying said SC1 solution comprises applying said mixture of water (H$_2$O), NH$_4$OH, and H$_2$O$_2$ to said second portion of said first TiN layer in a temperature range approximately from 25 to 65 degree C.

9. The method of claim 8, wherein applying said SC1 solution comprises applying said mixture of water (H$_2$O), NH$_4$OH, and H$_2$O$_2$ to said second portion of said first TiN layer in a temperature range approximately from 45 to 55 degree C.

10. The method of claim 1, comprising forming said third TiN layer on top of said metal-containing layer and forming a gate stack containing said metal-containing layer, wherein said metal-containing layer is a metal-silicide layer.

11. The method of claim 1, wherein forming said metal-containing layer comprises forming a layer of tungsten (W) metal, through sputtering, said tungsten metal layer having a thickness from about 4 nm to about 20 nm.

12. The method of claim 11, further comprising removing said tungsten metal layer after etching said second portion of said first TiN layer away from said area of semiconductor substrate designated for said second type of field-effect-transistors and thus exposing an underneath hafnium-oxide (HfO$_2$) layer.

13. The method of claim 12, wherein removing said tungsten metal layer comprises applying a chemical etching solution to said tungsten, said chemical etching solution being selective to both TiN and HfO$_2$, with selectivity greater than 20:1.

14. The method of claim 13, wherein applying said chemical etching solution to said tungsten comprises applying a hydrogen peroxide solution, at a temperature range of about 25 to 30 degree C. to remove said tungsten and expose said first portion of said first TiN layer, which covers said area designated for said first type of field-effect-transistors.

15. The method of claim 1, further comprising, before forming said metal-containing layer on said first TiN layer, forming said first TiN layer on a hafnium-oxide (HfO$_2$) layer, said HfO$_2$ layer covering said areas of said semiconductor substrate designated for said first and second types of field-effect-transistors.

16. The method of claim 15, further comprising, before forming said first TiN layer, forming said HfO$_2$ layer on a chemical oxide layer, said chemical oxide layer is a silicon-dioxide layer incorporating nitrogen and covering said areas of said semiconductor substrate designated for said first and second types of field-effect-transistors.

17. The method of claim 16, further comprising, forming said chemical oxide layer directly on top of said areas of said semiconductor substrate; forming said HfO$_2$ layer directly on top of said chemical oxide layer; and forming said first TiN layer directly on top of said HfO$_2$ layer.

18. The method of claim 1, further comprising tailoring properties of said third TiN layer differently from that of said first TiN layer to be suitable as gate stack for said second type of field-effect-transistors.

19. The method of claim 1, wherein said first type of field-effect-transistor is a p-type doped field-effect-transistor (PFET) and said second type of field-effect-transistor is an n-type doped field-effect-transistor (NFET).

20. The method of claim 1, wherein said first type of field-effect-transistor is an n-type doped field-effect-transistor (NFET) and said second type of field-effect-transistor is a p-type doped field-effect-transistor (PFET).

21. A method of forming gate stacks for field-effect-transistors, the method comprising:
    forming a metal-silicide layer on a first titanium-nitride (TiN) layer, said first TiN layer covering areas of a semiconductor substrate relating to first and second types of field-effect-transistors;
    forming a capping layer of a second TiN layer on top of said metal-silicide layer;
    patterning said second TiN layer and said metal-silicide layer to cover only a first portion of said first TiN layer, said first portion of said first TiN layer covering an area relating to said first type of field-effect-transistors;
    etching away a second portion of said first TiN layer exposed by said patterning to expose an underneath hafnium oxide (HfO$_2$) layer; and
    forming a third TiN layer covering said exposed HfO$_2$ layer as a gate stack for said second types of field-effect-transistors.

22. The method of claim 21, further comprising, before forming said first TiN layer, forming said HfO$_2$ layer on a chemical oxide layer, said chemical oxide layer is a silicon-dioxide layer incorporating nitrogen and covering said areas of said semiconductor substrate relating to said first and second types of field-effect-transistors.

23. The method of claim 22, further comprising, before forming said HfO$_2$ layer, forming said chemical oxide layer, said chemical oxide layer having a thickness of about 0.5 nm to about 2 nm and is formed in a chemical solution containing Ozone.

24. A method of forming gate stacks for field-effect-transistors, the method comprising:
    forming a metal layer on a first titanium-nitride (TiN) layer, said first TiN layer covering areas of a semiconductor substrate relating to first and second types of field-effect-transistors;
    forming a capping layer of a second TiN layer on top of said metal layer;
    patterning said second TiN layer and said metal layer to cover only a first portion of said first TiN layer, said first portion of said first TiN layer covering an area relating to said first type of field-effect-transistors;
    etching away a second portion of said first TiN layer exposed by said patterning to expose an underneath hafnium-containing layer; and
    forming a third TiN layer covering said exposed hafnium-containing layer as a gate stack for said second types of field-effect-transistors.

25. The method of claim 24, further comprising, before forming said third TiN layer, removing said metal layer from the top of said first portion of said first TiN layer.

26. The method of claim 25, wherein said metal layer is a tungsten layer and said hafnium-containing layer is a hafnium-oxide (HfO$_2$) layer, and removing said metal layer comprises applying a chemical etching solution to said tungsten, said chemical etching solution being selective to both TiN and HfO$_2$, with selectivity greater than 20:1.

27. The method of claim 24, wherein said hafnium-containing layer is selected from a group consisting of hafnium-oxide, hafnium-silicate, hafnium oxy nitride, and hafnium silicon oxy nitride.

* * * * *